United States Patent
Kirsch et al.

(10) Patent No.: US 8,925,179 B2
(45) Date of Patent: Jan. 6, 2015

(54) MOUNTING AND FASTENING MECHANISM

(75) Inventors: Craig Kirsch, Key Largo, FL (US); Daniel Kinard, Coconut Grove, FL (US)

(73) Assignee: Gables Engineering, Inc., Coral Gables, FL (US)

( * ) Notice: Subject to any disclaimer, the term of this patent is extended or adjusted under 35 U.S.C. 154(b) by 222 days.

(21) Appl. No.: 13/570,958

(22) Filed: Aug. 9, 2012

(65) Prior Publication Data

US 2013/0043359 A1    Feb. 21, 2013

Related U.S. Application Data

(60) Provisional application No. 61/525,279, filed on Aug. 19, 2011.

(51) Int. Cl.
*B23P 11/00* (2006.01)
*H05K 7/14* (2006.01)
*F16B 2/10* (2006.01)

(52) U.S. Cl.
CPC ............. *H05K 7/1412* (2013.01); *F16B 2/10* (2013.01)
USPC ............. 29/525.01; 29/525.02; 248/27.1; 248/27.3; 248/229.1; 248/229.13

(58) Field of Classification Search
USPC ............. 29/525.01, 525.02, 525.03, 428; 248/222.12, 229.1, 229.13, 231.51, 248/309.1, 316.1, 316.5, 27.1, 27.3
See application file for complete search history.

(56) References Cited

U.S. PATENT DOCUMENTS

| | | | |
|---|---|---|---|
| 5,373,419 A | 12/1994 | Wright | |
| 5,629,836 A | 5/1997 | Wright | |
| 5,732,987 A * | 3/1998 | Wright et al. | ............... 292/113 |
| 6,123,314 A | 9/2000 | Steele | |
| 6,515,866 B2 * | 2/2003 | Ulrich | ............... 361/759 |
| 6,549,424 B1 | 4/2003 | Beseth et al. | |
| 6,829,809 B2 | 12/2004 | Labrousse et al. | |
| 6,884,096 B2 * | 4/2005 | Centola et al. | ............... 439/157 |
| 7,107,650 B2 | 9/2006 | Labrousse et al. | |
| 7,417,866 B1 | 8/2008 | Beseth et al. | |
| 8,295,055 B2 * | 10/2012 | Van Der Mee et al. | ....... 361/759 |
| 2003/0183730 A1 | 10/2003 | Landes | |

FOREIGN PATENT DOCUMENTS

| | | |
|---|---|---|
| EP | 587451 A1 | 3/1994 |
| EP | 699019 A1 | 2/1996 |
| EP | 1302096 B1 | 2/2006 |

* cited by examiner

*Primary Examiner* — Ryan J Walters
(74) *Attorney, Agent, or Firm* — Michael J. Buchenhorner

(57) ABSTRACT

A mounting mechanism includes: a support member; a rail attached to the support member; and a fastener affixed to the second side of the rail. The rail includes: a plurality of rail holes for stud engagement; a first side facing a device to be engaged to the mounting mechanism; and a second side. The fastener includes: a clamping arm; a clamp lever pivotally associated with the clamping arm; and a moveable locking latch securing the clamp lever in one of two positions: open and closed.

4 Claims, 9 Drawing Sheets

MOUNTING AND FASTENING MECHANISM

CROSS-REFERENCE TO RELATED APPLICATIONS

This application is a non-provisional of, and claims priority to, U.S. Provisional Patent Application Ser. No. 61/525,279, filed on Aug. 19, 2011, which application is incorporated as if fully set forth herein.

STATEMENT REGARDING FEDERALLY SPONSORED-RESEARCH OR DEVELOPMENT

None.

INCORPORATION BY REFERENCE OF MATERIAL SUBMITTED ON A COMPACT DISC

None.

FIELD OF THE INVENTION

The invention disclosed broadly relates to the field of mounting mechanisms, and more particularly relates to the field of mounting mechanisms for avionics equipment.

BACKGROUND OF THE INVENTION

Dzus rails are convenient structural supports used for panels or removable parts to be fastened. They are frequently used in the various control panel structures found in a cockpit. The general mode of attachment requires securing the avionics device transversely to two parallel Dzus rails. The difficulty lies in the amount of panel front surface area occupied by the currently standard Dzus fasteners. Current Dzus fasteners are cylindrical, and typically located at the corners of panels. The fasteners occupy a substantial area of each corner, and make it difficult to use the surface area, both horizontally and vertically, between the Dzus fasteners.

SUMMARY OF THE INVENTION

Briefly, according to an embodiment of the present invention a mounting mechanism includes: a support member; a rail attached to the support member; and a fastener affixed to the second side of the rail. The rail includes: a plurality of rail holes for stud engagement; a first side facing a device to be engaged to the mounting mechanism; and a second side. The fastener includes: a clamping arm; a clamp lever pivotally associated with the clamping arm; and a moveable locking latch securing the clamp lever in one of two positions: open and closed.

Briefly, according to another embodiment of the present invention, a method for securing a device to a mounting mechanism includes: providing a mounting mechanism; setting the fastener to the open position by releasing the moveable locking latch, thereby causing the clamping arm to swing to the open position; affixing the device to the first side of the rail; positioning the fastener to grab the second side of the rail; setting the fastener to the closed position; and securing the device to the rail. The mounting mechanism includes: a support member; a rail attached to the support member; and a fastener affixed to the second side of the rail. The fastener includes: a clamping arm; a clamp lever pivotally associated with the clamping arm, wherein rotation of the clamp lever in a first direction moves the clamping arm clear of the rail, allowing the device to be disengaged from the mounting mechanism, and wherein rotation of the clamp lever in a second direction moves the clamping arm in locking engagement with the rail.

BRIEF DESCRIPTION OF THE SEVERAL VIEWS OF THE DRAWINGS

To describe the foregoing and other exemplary purposes, aspects, and advantages, we use the following detailed description of an exemplary embodiment of the invention with reference to the drawings, in which.

Figure 1:
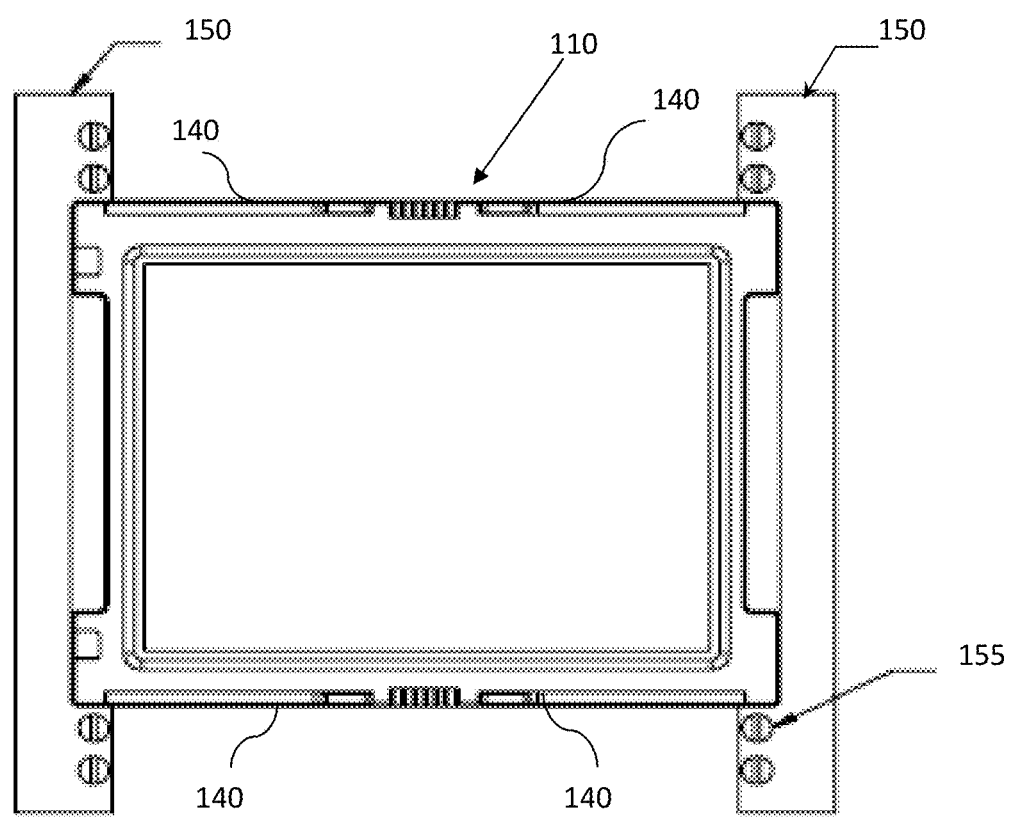
FIG. 1 shows a plan view of an electronic device within the mounting mechanism clamped to Dzus rails, according to an embodiment of the present invention.

While the invention as claimed can be modified into alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the scope of the present invention.

DETAILED DESCRIPTION

We describe a mounting mechanism with a plurality of fasteners that clamp to the backside of standard 5.00 inch wide Dzus rails that meet the dimensional specifications defined in MS25212. A Dzus rail as used in avionics acts as a supporting frame for panels or removable parts to be fastened, with continuous holes for stud engagement and rivet mounting. The rail is riveted to a support member and the stud panel rests against the strip face having the stud holes. The rails can be made of an aluminum alloy.

According to an embodiment of the invention, the proposed mounting and fastening mechanism utilizes several planar components that are concentrated on the top and bottom of a given panel. These components are made to pivot in order to fasten or release the panel from the Dzus rail structure. The design results in less vertical space being required for the latching mechanism, which allows for a greater amount of the panel's front surface area to be populated with displays or controls.

The clamps are spring loaded in order to apply a compressive force comparable to a standard Dzus fastener. Each clamp has an associated latch handle which serves to engage or disengage the clamp. These handles are loaded with a secondary spring that causes the handle and clamp to tend towards an open position when not latched closed. The clamp fixture has alignment pegs that come to rest within the Dzus rail holes to ensure that the unit remains fixed in its proper position. We use two latch release sliders, with each slider serving to disengage a pair of fasteners.

In the examples and illustrations to follow, we discuss the mounting mechanism using existing Dzus rails in a cockpit. We do not, however, use the standard Dzus fasteners because they take up more front panel space on the unit. Instead, our clamps grab the Dzus rails from underneath.

Referring now in specific detail to the drawings, and particularly FIG. 1, there is provided a pictorial illustration of a top plan view of a mounting mechanism 110 attached to Dzus rails 150 with four fasteners 140. Rail holes 155 are shown with the attached studs.

Figure 2:
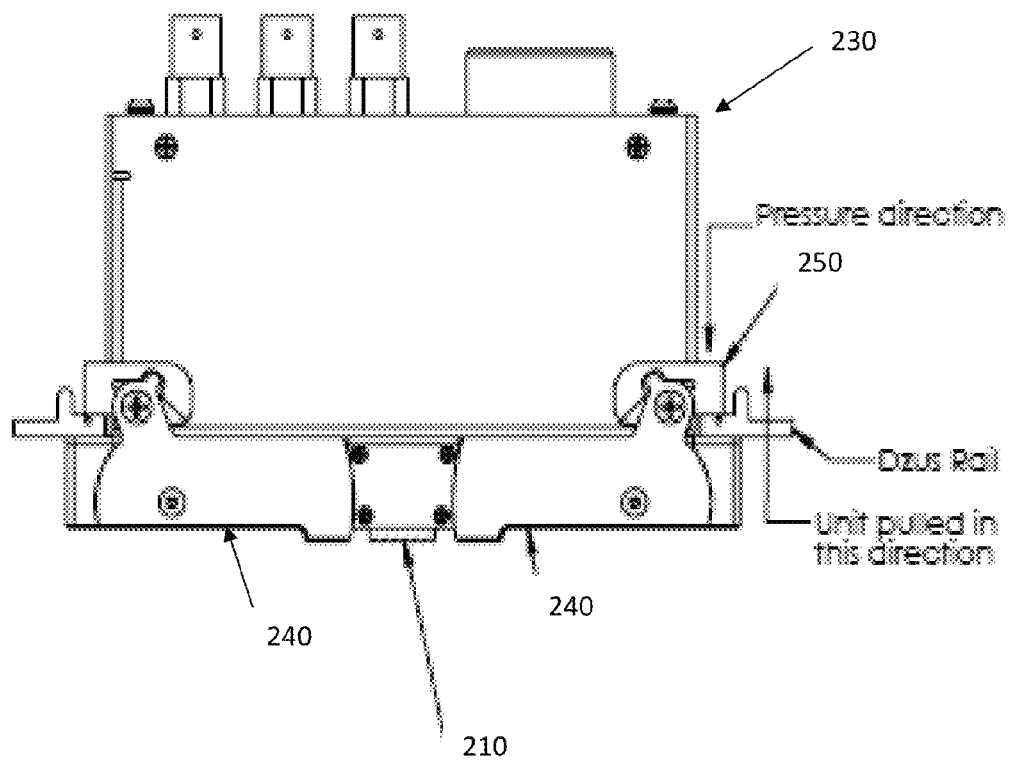
FIG. 2 shows an elevation of the mounting mechanism of FIG. 1, with the clamp lever in the locked position, according to an embodiment of the present invention.

FIG. 2 shows an elevation view of the mounting mechanism 110. In this view the locking latch is shown in the LOCKED position. The locking latch 210 secures the clamp lever 240 in position. Two clamp levers 240 are shown. The clamp lever 240 swings the clamping arm 250 into either the LOCKED or OPEN positions. The torsion spring loaded clamping arm 250 applies pressure to the rear of the Dzus rail 150, pulling the unit 230 to the Dzus rail 150, thus securing it in place.

Figure 3:
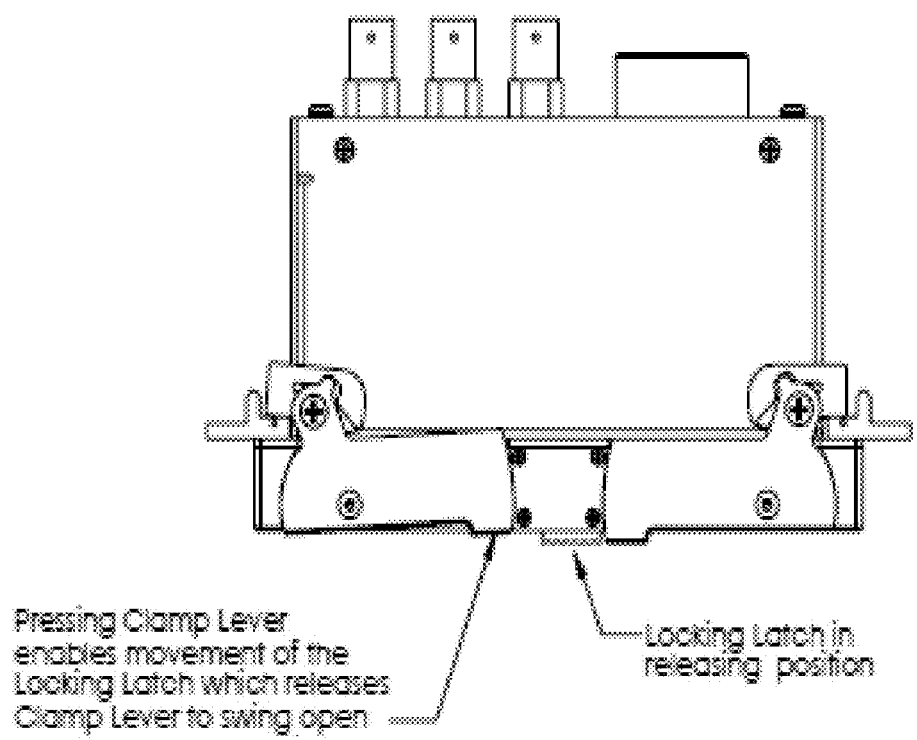
FIG. 3 shows the mounting mechanism of FIG. 2 with the clamp lever in the releasing position, according to an embodiment of the present invention.
Figure 4:
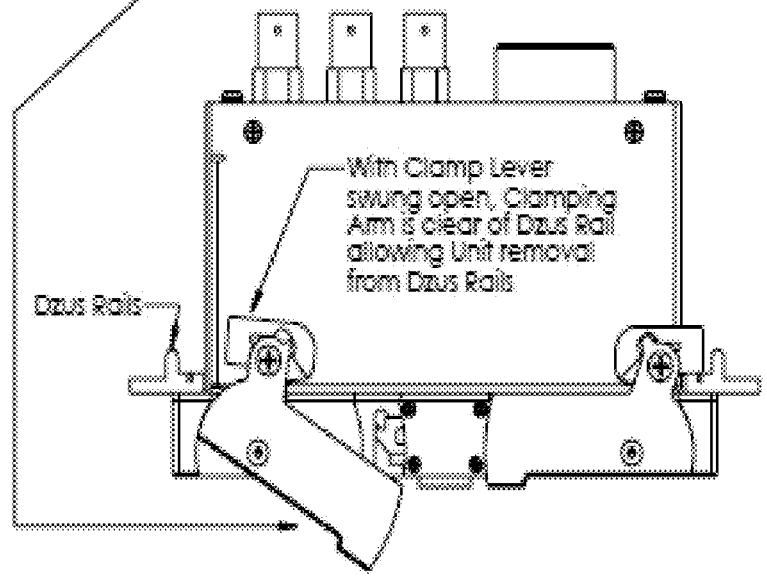
FIG. 4 shows the mounting mechanism of FIG. 3 with the clamp lever in the OPEN position, according to an embodiment of the present invention.

FIG. 3 shows how pressing the clamp lever 240 enables movement of the locking latch 210 which releases the clamp lever 240 to swing OPEN. Here the locking latch 210 is shown in a releasing position. FIG. 4 shows the clamp lever 240 swung OPEN. The clamping arm 250 is clear of the Dzus rail 150, allowing the unit 230 to be easily unclamped from the Dzus rails 150. FIG. 4 shows only one of the clamp levers 240 in the OPEN position. In order to fully remove the unit 230, both levers 240 must be OPEN.

Figure 5A:
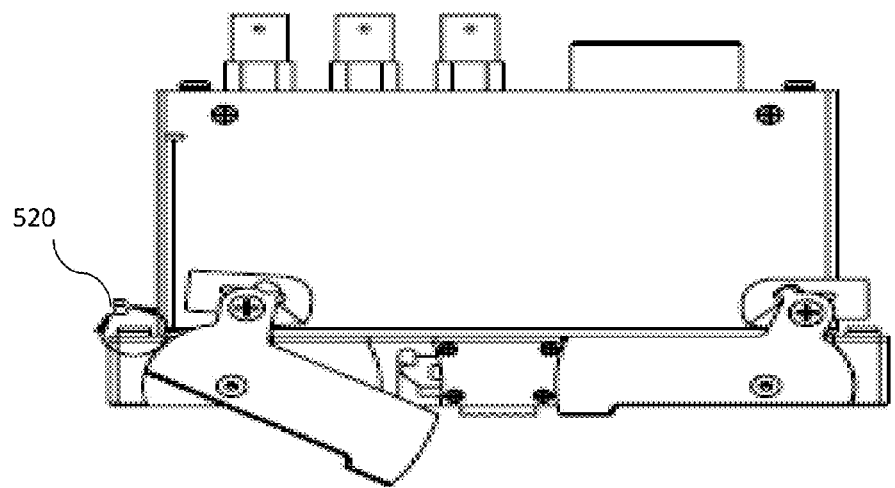
FIG. 5A shows the mounting mechanism of FIG. 4 with the stud attachment circled, according to an embodiment of the present invention.
Figure 5B:
FIG. 5B shows an exploded view of the stud attachment to the Dzus rail hole, according to an embodiment of the present invention.
Figure 6:
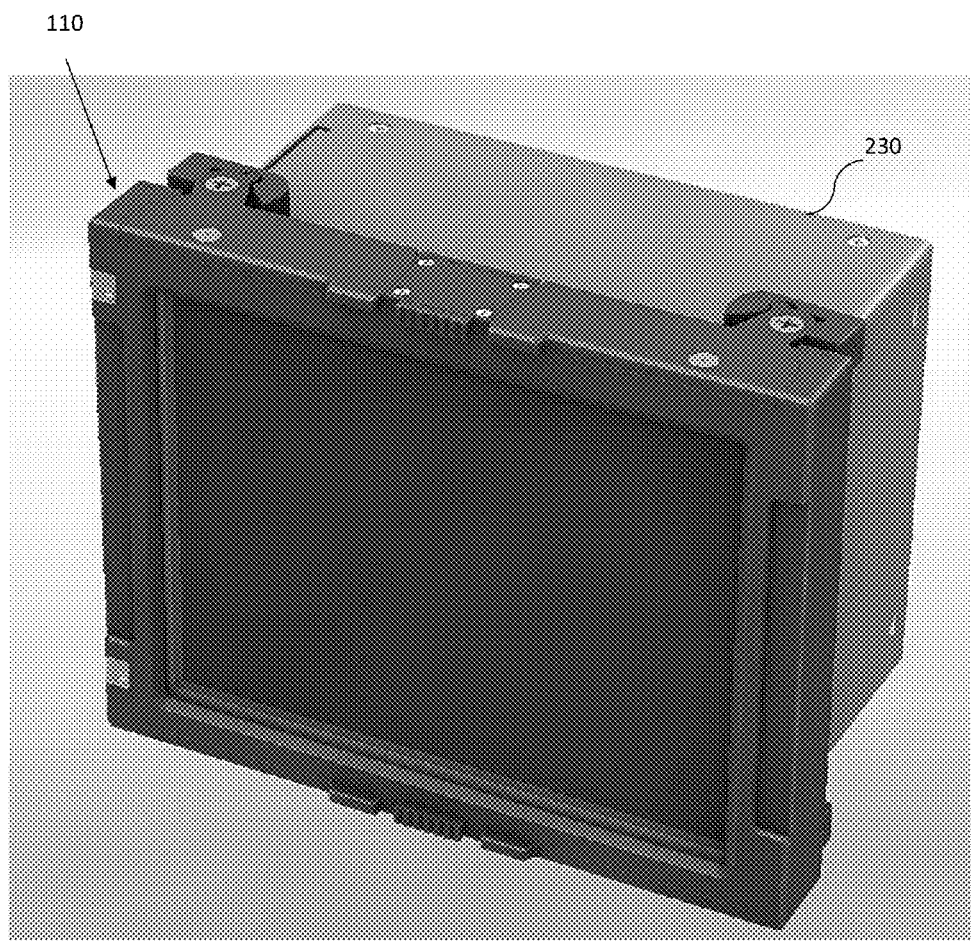
FIG. 6 shows a three-dimensional view of the avionics electronic device with the mounting mechanism, according to an embodiment of the present invention.
Figure 7:
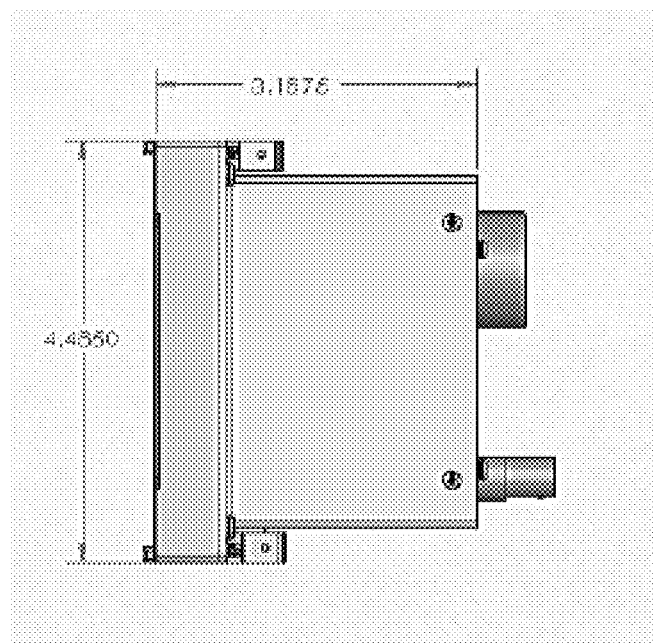
FIG. 7 shows a side view of the avionics electronic device with the mounting mechanism, according to an embodiment of the present invention.
Figure 8:
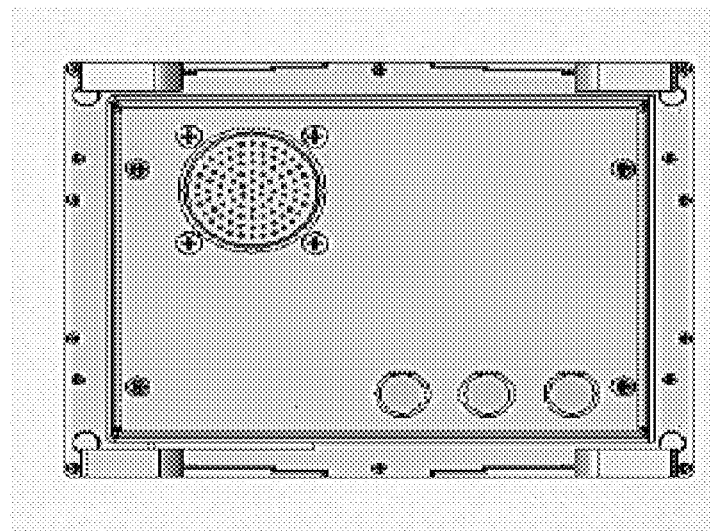
FIG. 8 shows a rear plan view of the device with the mounting mechanism, according to an embodiment of the present invention.

FIG. 5A shows the mechanism of FIG. 4 with the stud attachment 520 circled. In FIG. 5B we show an exploded view of the stud attachment 520 to the Dzus rail holes 155. When the studs 520 from the unit 230 are inserted into the rail holes 155, they secure the unit 230 vertically and horizontally. FIG. 6 shows a three-dimensional view of the mechanism 110. FIG. 7 shows a side view of the mechanism 110 of FIG. 6 and FIG. 8 shows a top plan view.

Figure 9:
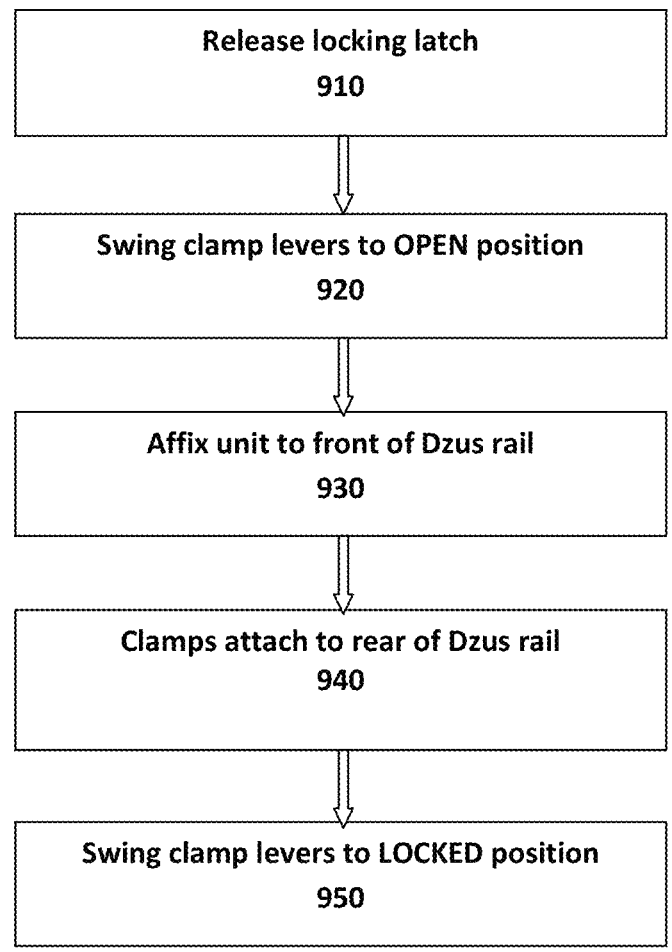
FIG. 9 is a flowchart of a method according to an embodiment of the invention.

The method for novel Dzus attachment proceeds as shown in the flowchart of FIG. 9. We begin with the device 230 shown in FIG. 6 with the mounting mechanism 110. The device 230 can be any electronics device, but for purposes of this invention, we show an avionics device 230 with a built-in mounting mechanism 110. Alternately, the mounting mechanism can be separate and attached to the device 230 when needed. The device 230 can also be nested within the mounting mechanism 110.

First, the locking latch 210 is released in step 910 in order to allow someone to swing the clamp levers 240 to the OPEN position in step 920. With the mounting mechanism 110 in the OPEN state, we affix the unit 230 to the front of the Dzus rails 150 in step 930. Then we position the clamps 250 to grab the back of the Dzus rails 150 in step 940. Once the mounting mechanism 110 is in the desired position, we swing the clamp levers 240 to the LOCKED position in step 950 which provides the clamping force. This secures the device 230 to the Dzus rails 150 while preventing movement of the device 230 in the x, y, and z directions. The torsion spring-loaded clamping arm 250 applies counter-pressure to the rear of the Dzus rail 150, pulling the unit 230 to the Dzus rail 150, thus restricting its movement.

We claim:

1. A method for securing a device to a mounting mechanism, comprising:
   A) providing a mounting mechanism comprising:
      a support member;
      at least two rails attached to the support member, each rail comprising:
         a plurality of rail holes for stud engagement disposed along the rail;
         a first side facing the device to be engaged to the mounting mechanism; and
         a second side;
      a pair of fasteners respectively affixed to the second side of each of the rails, each fastener comprising:
         a clamping arm; and
         a clamp lever pivotally associated with the clamping arm, wherein rotation of the clamp lever in a first direction moves the clamping arm clear of the rail, allowing the device to be disengaged from the mounting mechanism, and wherein rotation of the clamp lever in a second direction moves the clamping arm in locking engagement with the rail;
         and a moveable locking latch serving each pair of fasteners, each moveable locking latch securing the clamp levers of the respective pair of fasteners in one of two positions:
   open and closed;
   B) setting the fasteners to an open position by releasing the moveable locking latch, thereby causing each clamping arm to swing to an open position;
   C) affixing the device to the first sides of at least two rails with the fasteners in the open position;
   D) positioning the fasteners to grab the second side of the respective rails;
   E) setting the fasteners to a closed position, thereby providing clamping forces on the respective rails; and
   F) securing the device to the rails, thus preventing movement of the device in the x, y, and z directions.

2. The method of claim 1 wherein the rail is a Dzus rail.

3. The method of claim 1 further comprising providing torsion spring-loading to each clamping arm.

4. The method of claim 1 wherein the at least two rails are attached to the support member by riveting.

* * * * *